United States Patent
Seo et al.

(10) Patent No.: US 9,280,287 B2
(45) Date of Patent: Mar. 8, 2016

(54) METHOD OF COMPRESSING DATA AND DEVICE FOR PERFORMING THE SAME

(71) Applicants: Man Keun Seo, Hwaseong-Si (KR); Dae Wook Kim, Osan-Si (KR); Hong Rak Son, Anywang-Si (KR); Jun Jin Kong, Yongin-Si (KR)

(72) Inventors: Man Keun Seo, Hwaseong-Si (KR); Dae Wook Kim, Osan-Si (KR); Hong Rak Son, Anywang-Si (KR); Jun Jin Kong, Yongin-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 6 days.

(21) Appl. No.: 14/135,628

(22) Filed: Dec. 20, 2013

(65) Prior Publication Data
US 2014/0189279 A1     Jul. 3, 2014

(30) Foreign Application Priority Data
Jan. 2, 2013     (KR) .................. 10-2013-0000074

(51) Int. Cl.
G06F 13/00     (2006.01)
G06F 13/38     (2006.01)
G06F 3/06     (2006.01)
H03M 7/30     (2006.01)

(52) U.S. Cl.
CPC ............ *G06F 3/0608* (2013.01); *G06F 3/0641* (2013.01); *G06F 3/0655* (2013.01); *G06F 3/0673* (2013.01); *G06F 3/0679* (2013.01); *H03M 7/3086* (2013.01); *H03M 7/6082* (2013.01)

(58) Field of Classification Search
None
See application file for complete search history.

(56) References Cited

U.S. PATENT DOCUMENTS

| | | | | |
|---|---|---|---|---|
| 5,977,977 A * | 11/1999 | Kajiya et al. | .......... | G06T 11/001 345/418 |
| 5,990,955 A * | 11/1999 | Koz | .......... | H04N 19/176 375/240.01 |
| 6,480,946 B1 * | 11/2002 | Tomishima et al. | ... | G11C 5/063 711/167 |
| 6,658,148 B1 | 12/2003 | Fung et al. | | |
| 6,763,444 B2 * | 7/2004 | Thomann et al. | .......... | G11C 7/22 702/89 |

(Continued)

FOREIGN PATENT DOCUMENTS

WO     WO2007-0138600 A2     12/2007

OTHER PUBLICATIONS

EPO Search Report dated Jul. 1, 2015.
(Continued)

*Primary Examiner* — Michael Sun
(74) *Attorney, Agent, or Firm* — Volentine & Whitt, PLLC

(57) ABSTRACT

A data compression method includes receiving an input data stream including a previous data block and a current data block, and executing a first comparison of a part of the previous data block with part of a previous reference data block, and a second comparison of the current data block with a current reference data block, where the first and second comparisons are executed in parallel. The method further includes selectively, based on results of the first and second comparisons, outputting the current data block or compressing an extended data block, where the extended data block includes the part of the previous data block and the current data block.

25 Claims, 14 Drawing Sheets

(56) References Cited

U.S. PATENT DOCUMENTS

| | | | |
|---|---|---|---|
| 7,441,156 B2 | 10/2008 | An | |
| 2002/0091905 A1* | 7/2002 | Geiger et al. | 711/170 |
| 2004/0250009 A1* | 12/2004 | Chen et al. | 711/103 |
| 2006/0069857 A1 | 3/2006 | Lekatsas et al. | |
| 2006/0259168 A1* | 11/2006 | Geyersberger et al. | 700/94 |
| 2006/0273933 A1 | 12/2006 | Kerber et al. | |
| 2007/0050514 A1* | 3/2007 | Fallon | 709/231 |
| 2010/0039305 A1* | 2/2010 | Yoshioka | H03K 3/356121 341/155 |
| 2010/0254679 A1* | 10/2010 | Sasaki et al. | 386/108 |

OTHER PUBLICATIONS

Huang W-J et al: "A reliable LZ data compressor on reconfigurable coprocessors", Field-Programmable Custom Computing Machines, 2000 IEEE Symposium on Napa Valley, CA, USA Apr. 17-19, 2000, Los Alamitos, CA, USA, IEEE Comput. Soc, US, Apr. 17, 2000, pp. 249-258.

Sergio De Agostino: "Lempel-Ziv Data Compression on Parallel and Distributed Systems", Data Compression, Communications and Processing (CCP), 2011 First International Conference on, IEEE, Jun. 21, 2011, p. 193-202.

* cited by examiner

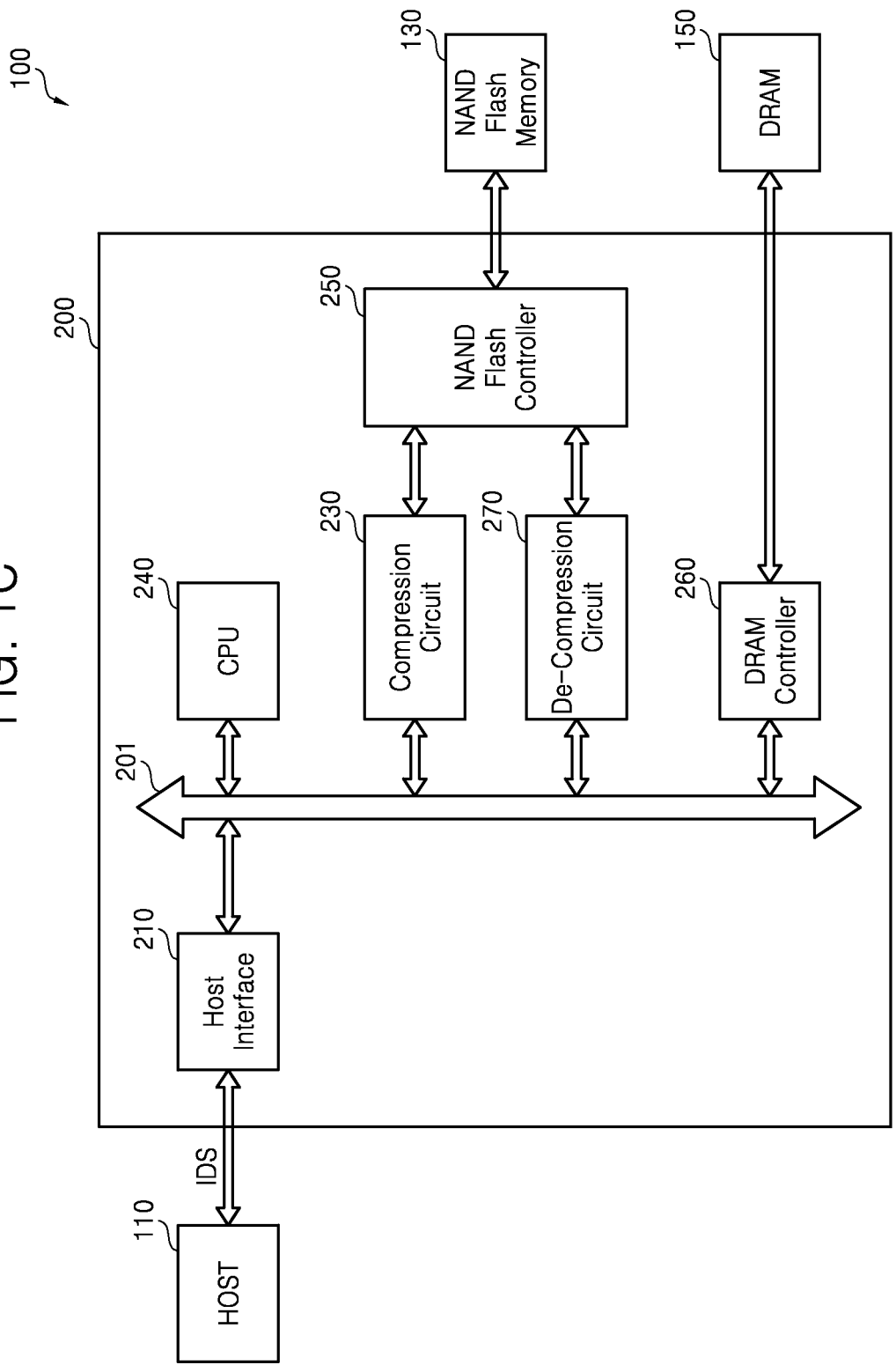

METHOD OF COMPRESSING DATA AND DEVICE FOR PERFORMING THE SAME

CROSS-REFERENCE TO RELATED APPLICATIONS

A claim of priority under 35 U.S.C. §119(a) is made to Korean Patent Application No. 10-2013-0000074, filed on Jan. 2, 2013, the disclosure of which is hereby incorporated by reference in its entirety.

BACKGROUND

Embodiments of the inventive concept relate to data compression technology, and more particularly, to data compression methods and devices for data compression acceleration and for compensation of a data compression ratio lost during the data compression acceleration.

Data compression technology is generally utilized to increase an effective data transfer rate and/or an effective data storage capacity in communication devices and/or data storage devices. In addition, since data compression reduces the amount of data to be stored in a data storage device (e.g., a flash storage device), the number of writes and/or the number of reads in the storage device is decreased, thereby increasing the life expectancy of the storage device.

Generally, data compression can be categorized as lossless compression or lossy compression. Lossless data compression is characterized by an exact regeneration of original data, whereas lossy data compression allows for an approximation of the original data.

Examples of lossless data compression algorithms include techniques referred to as "LZ77" and "LZ78," which were disclosed in papers written by Abraham Lempel and Jacob Ziv in 1977 and 1978. Another example of a lossless data compression algorithm is referred to as "LZW" or Lempel-Ziv Ross Williams ("LZRW"), which was disclosed in a paper by Abraham Lempel, Jacob Ziv, and Terry Welch in 1984.

SUMMARY

According to some embodiments of the inventive concept, there is provided a data compression method which includes receiving an input data stream including a previous data block and a current data block, and executing a first comparison of a part of the previous data block with part of a previous reference data block, and a second comparison of the current data block with a current reference data block, where the first and second comparisons are executed in parallel. The method further includes selectively, based on results of the first and second comparisons, outputting the current data block or compressing an extended data block, wherein the extended data block includes the part of the previous data block and the current data block.

According to other embodiments of the inventive concept, there is provided a data compression method which includes receiving an input data stream including a previous data block and a current data block. The method further includes reading a part of a previous reference data block from a memory, and in parallel reading a current reference data block from the memory. The method further includes comparing a part of the previous data block with the part of the previous reference data block, and in parallel comparing the current data block with the current reference data block. The method further includes compressing an extended data block when the part of the previous data block matches the part of the previous reference data block, and the current data block matches the current reference data block, wherein the extended data block includes the part of the previous data block and the current data block.

According to still other embodiments of the inventive concept, there is provided a data compression circuit which includes a buffer memory including a first memory region, a second memory region, and a third memory region, and a buffer memory controller configured to output a part of a previous reference data block stored in the first memory region and a current reference data block stored in the second memory region in response to an address. The data compression circuit further includes a comparison circuit configured to determine whether a part of a previous data block matches the part of the previous reference data block and whether a current data block matches the current reference data block, and to generate control information according to a determination result. The data compression circuit further includes a compressed-data generation circuit configured to selectively output, based on the control information, the current data block or compressed data, wherein the compressed data is generated by compressing an extended data block including the part of the previous data block and the current data block.

According to further embodiments of the inventive concept, there is provided a data processing system which includes a data storage device, a host configured to output a data stream including a previous data block and a current data block, and a memory controller configured to determine a matching property of each data block or each extended data block in the data stream from the host, to compress the data block or the extended data block in the data stream according to a determination result, and to output compressed data to the data storage device. The memory controller determines the matching property of the previous data block, and then determines a matching property of the extended data block which includes a part of the previous data block and the current data block.

BRIEF DESCRIPTION OF THE DRAWINGS

The above and other aspects and features of the inventive concept will become apparent from the detailed description that follows, with reference to the accompanying drawings, in which:

FIGS. 1B and 1C are block diagrams of a data processing system according to other embodiments of the inventive concept;

DETAILED DESCRIPTION OF THE EMBODIMENTS

Figure 1A:
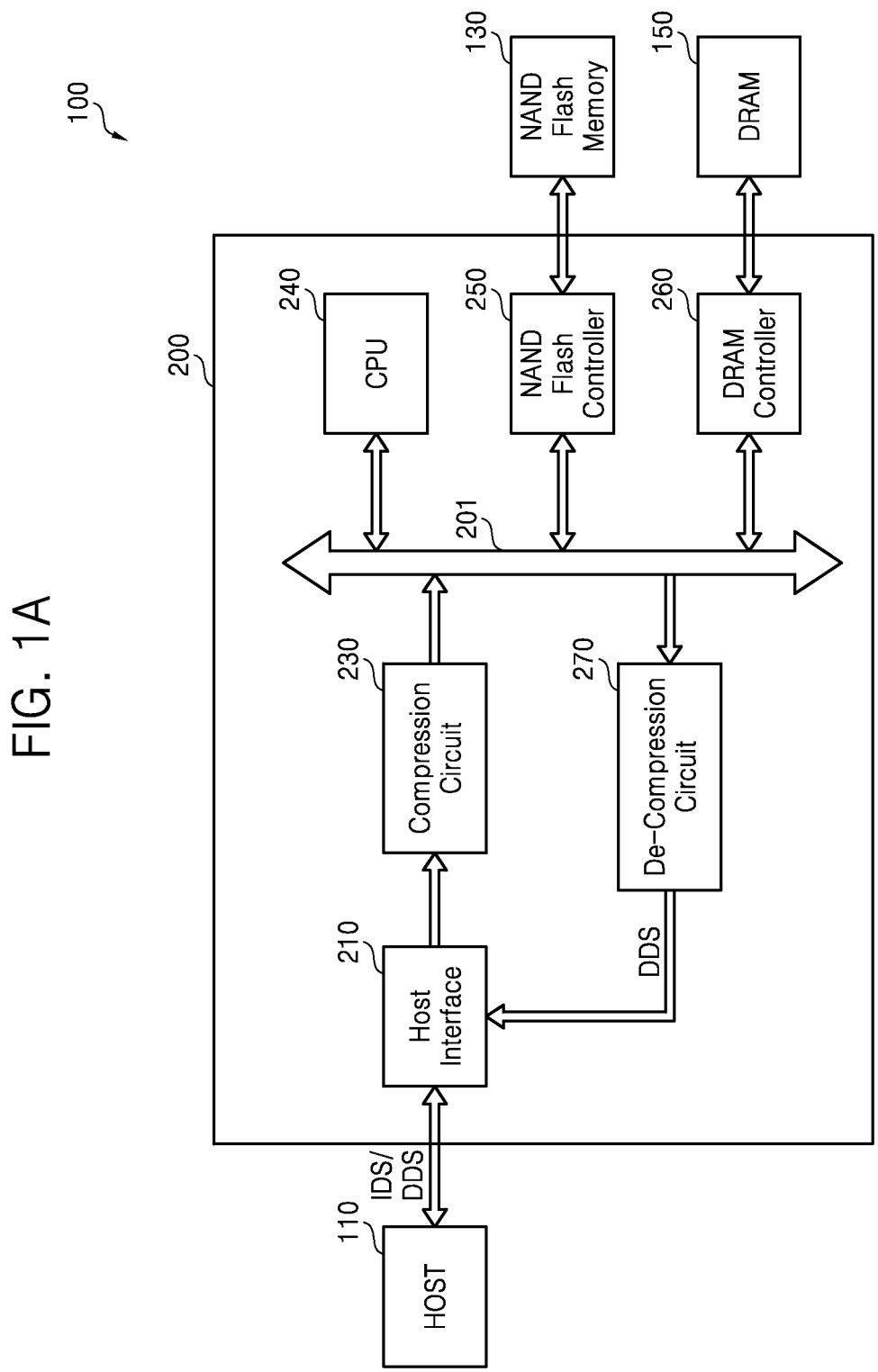
FIG. 1A is a block diagram of a data processing system according to some embodiments of the inventive concept.

The inventive concept now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1A is a block diagram of a data processing system 100 according to some embodiments of the inventive concept. The data processing system 100 includes a host 110, a memory controller 200, a first storage device 130, and a second storage device 150.

The memory controller 200 and the first storage device 130 may be packaged separately, or together in a single package, e.g., a package on package (PoP) or a multi-chip package.

The data processing system 100 may, for example, be implemented as a personal computer (PC), a data server, or a portable electronic device. Examples of a portable electronic device include a laptop computer, a mobile telephone, a smart phone, a tablet PC, a personal digital assistant (PDA), an enterprise digital assistant (EDA), a digital still camera, a digital video camera, a portable multimedia player (PMP), a personal (or portable) navigation device (PND), a handheld game console, a mobile internet device (MID), and an e-book.

The host 110 may output an input data stream IDS including data blocks to the memory controller 200. Each data block may be constituted by N bytes (where N is 2 or a natural number greater than 2) to allow for fast data compression. In addition, the host 110 may receive an output data stream DDS from the memory controller 200.

The memory controller 200 may process (for example, compress or bypass) the data blocks on a block by block basis. The memory controller 200 may compress an extended data block, which includes a current data block to be processed and part of a previous data block, in order to increase a compression ratio. For example, a ratio of a size of an extended data block to a size of a data block may be a mixed decimal, i.e., the byte size of the extended data block may be greater than that of the data block but not an exact multiple of that of the data block.

For convenience of description, it is assumed here that a data block is 4 bytes in length and an extended data block is 6 bytes in length. However, the inventive concept is not restricted by the respective number of bytes of the data block and extended data block.

The memory controller 200 may exchange or process data and/or commands among the host 110, the first storage device 130, and the second storage device 150 based on a corresponding interface protocol.

The memory controller 200 may include a host interface 210, a data compression circuit 230, a central processing unit (CPU) or a processor 240, a first memory controller 250, a second memory controller 260, and a data decompression circuit 270. The memory controller 200 may, for example, be implemented as a system on chip (SoC).

The host interface 210, e.g., a host side interface, exchanges data and/or commands between the host 110 and the memory controller 200. For instance, the host interface 210 transmits the input data stream IDS from the host 110 to the data compression circuit 230 during data compression, and transmits a decompressed output data stream DDS from the data decompression circuit 270 to the host 110 during data decompression.

The data compression circuit 230 may process (for example, compress or bypass) a data block or may process (for example, compress) an extended data block under control of the CPU 240. The data compression circuit 230 accelerates a compression process and minimizes a decrease in compression ratio. The data compression circuit 230 functions as an encoder.

The CPU 240 may control the operation of at least one of the data compression circuit 230, the first memory controller 250, the second memory controller 260, and the data decompression circuit 270 through a data bus 201.

The first memory controller 250 may exchange data and/or commands between the memory controller 200 and the first storage device 130 based on an interface protocol of the first storage device 130. In the case where the first storage device 130 is a NAND flash memory, the first memory controller 250 may be implemented as a NAND flash controller.

The second memory controller 260 may exchange data and/or commands between the memory controller 200 and the second storage device 150 based on an interface protocol of the second storage device 150. In the case where the second storage device 150 is a dynamic random access memory (DRAM), the second memory controller 260 may be implemented as a DRAM controller.

The data decompression circuit 270 may decompress compressed data and transmit the decompressed output data stream DDS to the host 110 via the host interface 210. The data decompression circuit 270 functions as a decoder.

The first storage device 130 may be a flash based memory such as a flash memory, an embedded multimedia card (eMMC), a universal flash storage (UFS), a universal serial bus (USB) flash drive, or a solid state drive (SSD).

Alternatively, the first storage device 130 may be a non-volatile memory such as electrically erasable programmable read-only memory (EEPROM), magnetic random access memory (MRAM), spin-transfer torque MRAM, conductive bridging RAM (CBRAM), ferroelectric RAM (FeRAM), phase-change RAM (PRAM), resistive RAM (RRAM), nanotube RRAM, polymer RAM (PoRAM), nano floating gate memory (NFGM), holographic memory, molecular electronic memory device, or insulator resistance change memory.

As another alternative, the first storage device 130 may be a hard disk drive.

The second storage device 150 may be DRAM or a double data rate (DDR) synchronous DRAM (SDRAM). Data input to/output from the first storage device 130 may be temporarily stored in the second storage device 150 according to control of the second memory controller 260.

Figure 1B:
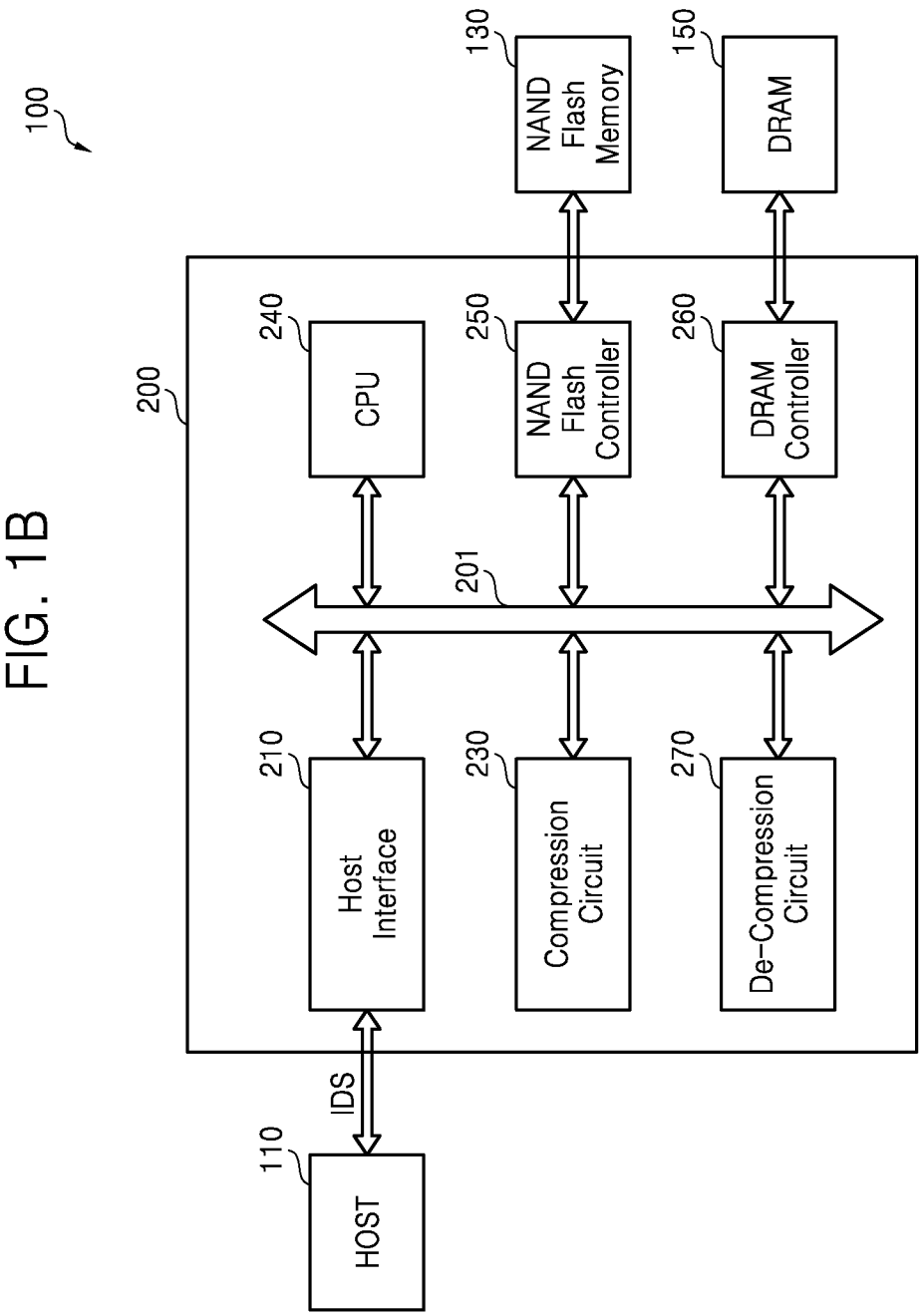

FIGS. 1B and 1C are block diagrams of a data processing system 100 according to other embodiments of the inventive concept, where like reference numbers refer to like elements of FIG. 1A. FIGS. 1B and 1C are presented to demonstrate that the integration of the data compression circuit 230 and/or the data decompression circuit 270 may be changed in a variety of different ways without departing from the inventive concept. For example, FIG. 1B illustrates a configuration in which the compression circuit 230 receives the input data stream IDS from the host interface 210 via the data bus 201, and likewise the decompression circuit 270 supplies the output data stream DDS to the host interface 210 via the data bus 201. As another example, FIG. 1C illustrates an example in which the compression circuit 230 and the decompression circuit 270 are operatively interposed between the data bus 201 and the first memory controller 250.

Figure 2:
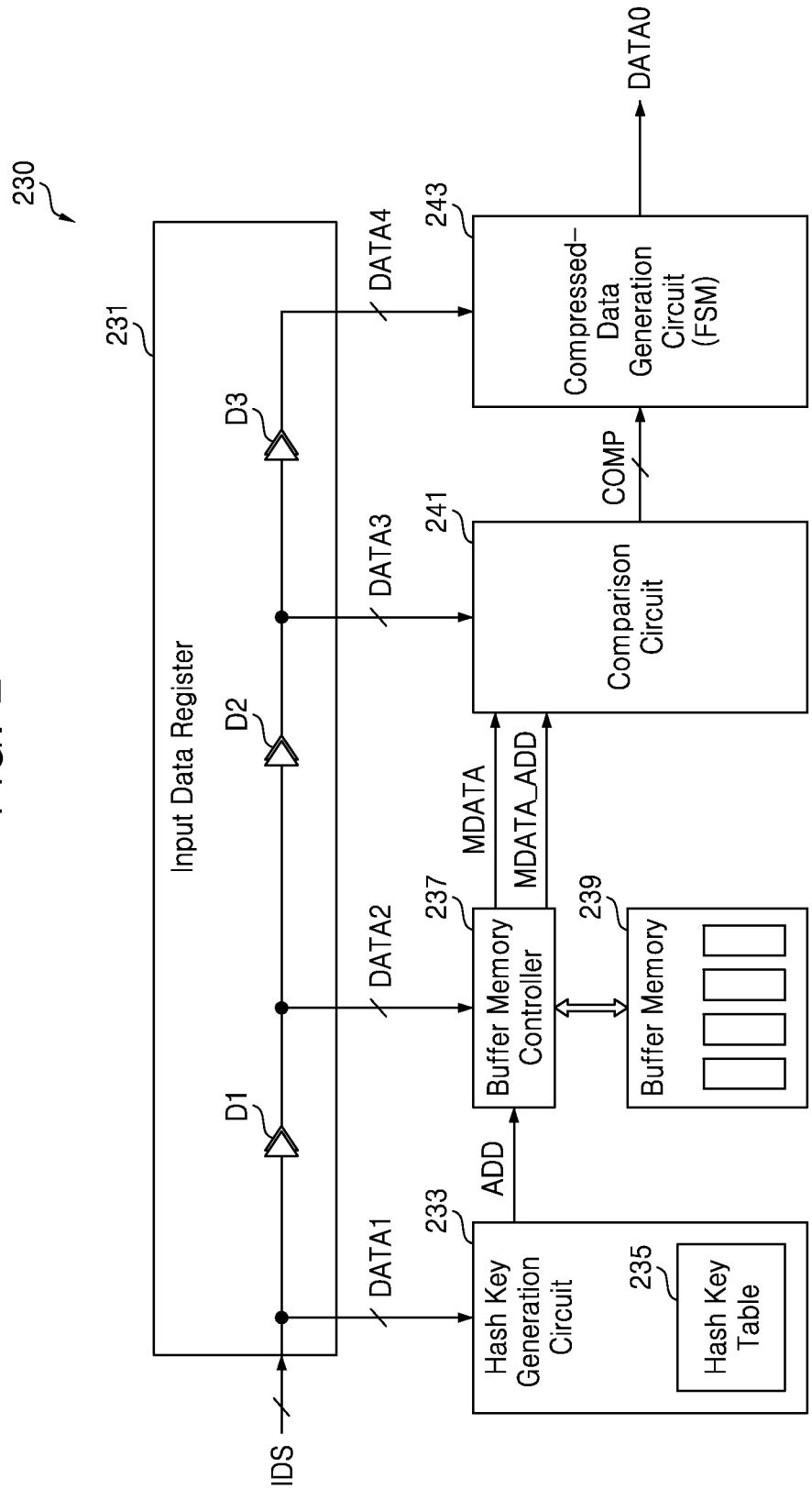
FIG. 2 is a block diagram showing an example of a data compression circuit illustrated in FIG. 1A.

FIG. 2 is a block diagram showing an example of the data compression circuit 230 illustrated in FIG. 1A. Referring to FIG. 2, the data compression circuit 230 includes an input data register 231, a hash key generation circuit 233, a buffer memory controller 237, a buffer memory 239, a comparison circuit 241, and a compressed-data generation circuit 243.

The input data register 231 receives the input data stream IDS, adjusts the delay of each of data blocks included in the input data stream IDS using a corresponding one of delay circuits D1, D2, and D3, and transmits delay-adjusted data blocks DATA2, DATA3, and DATA4 to the processing circuits 237, 241, and 243, respectively. The delay of the delay circuits D1, D2, and D3 may be adjusted depending on the process time of the processing circuits 233, 237, and 241, respectively.

The input data register 231 transmits a data block DATA1 included in the input data stream IDS to the hash key generation circuit 233, transmits the first delayed data block DATA2 to the buffer memory controller 237, transmits the second delayed data block DATA3 to the comparison circuit 241, and transmits the third delayed data block DATA4 to the compressed-data generation circuit 243. When the delay is ignored, the data blocks DATA1 through DATA4 are the same as one another.

Figure 3:
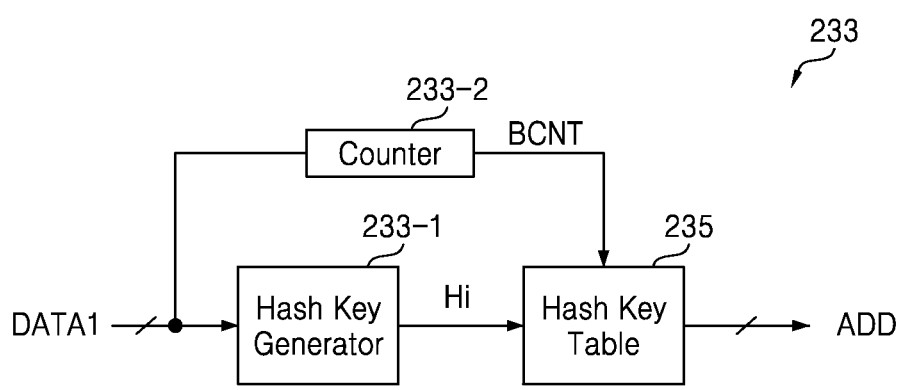
FIG. 3 is a block diagram showing an example of a hash key generation circuit illustrated in FIG. 2.

FIG. 3 is a block diagram showing an example of the hash key generation circuit 233 illustrated in FIG. 2. Referring to FIG. 3, the hash key generation circuit 233 generates a hash key Hi corresponding to each of data blocks (or data patterns) DATA1 sequentially received and writes a position or an address of a storage area included in the buffer memory 239, in which each data block exists or has been stored, to an entry in a hash key table 235, which corresponds to the hash key Hi. The hash key generation circuit 233 of this example includes a hash key generator 233-1, a first counter 233-2, and the hash key table 235.

Figure 4:
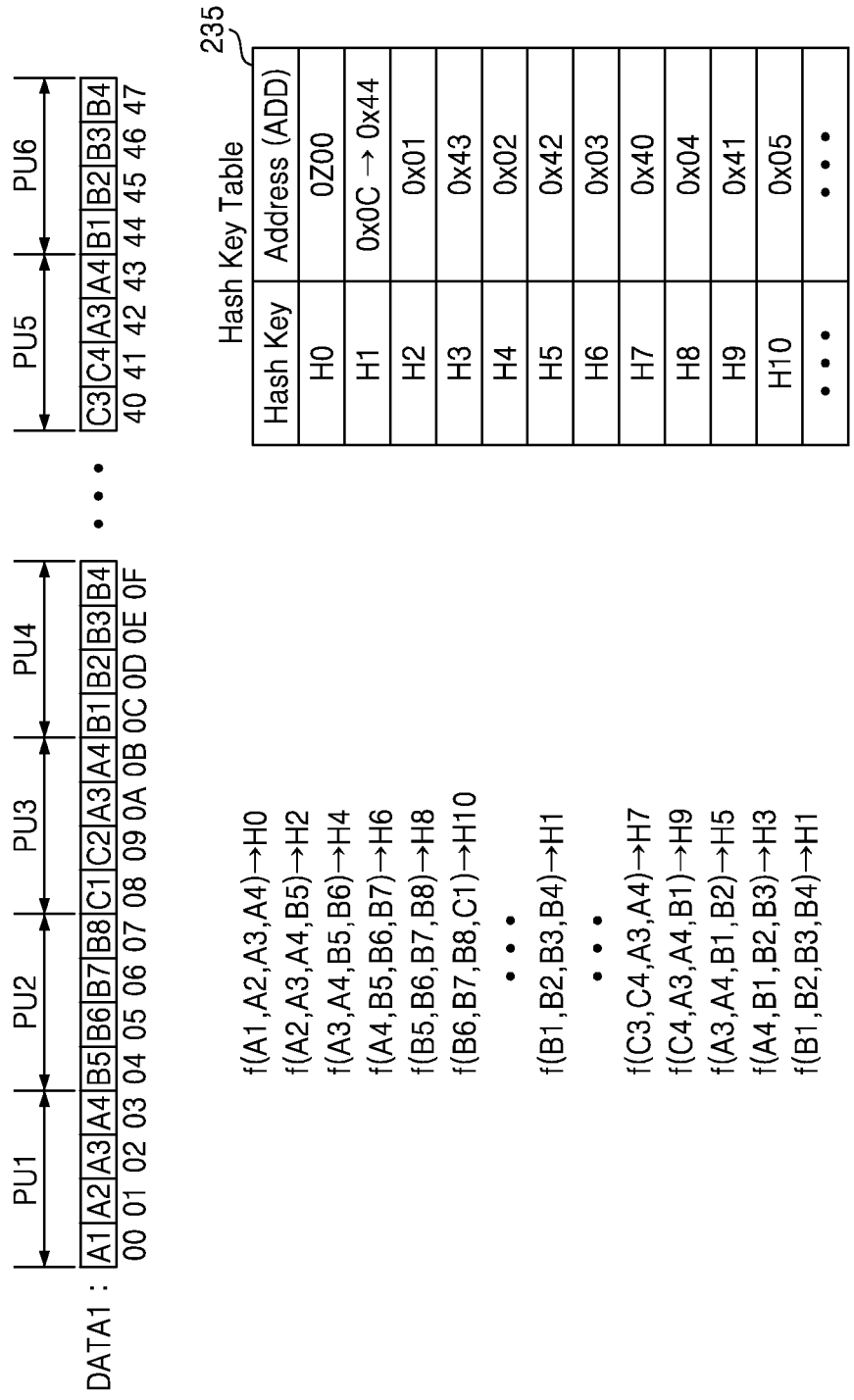
FIG. 4 is a conceptual diagram for explaining operational examples of the hash key generation circuit illustrated in FIG. 2.

FIG. 4 is a conceptual diagram for explaining operational examples of the hash key generation circuit 233 illustrated in FIG. 3. Referring to FIGS. 3 and 4, the hash key generator 233-1 generates the hash key Hi per L bytes (where L is a natural number and L=4 in the embodiments hereinafter), which construct a single data block, and outputs the hash key Hi to the hash key table 235.

The first counter 233-2 counts bytes included in each data block DATA1 and outputs a first count value BCNT to the hash key table 235 according to the counting result.

The hash key table 235 stores the first count value BCNT in an entry designated by the hash key Hi. At this time, the first count value BCNT may correspond to an address ADD.

The hash key generator 233-1 generates a hash key H0 corresponding to a first process unit PU1, i.e., 4-byte data A1A2A3A4 and the first counter 233-2 generates "0x00" as the first count value BCNT indicating the start position of the 4-byte data A1A2A3A4.

The hash key table 235 stores the first count value BCNT or the address ADD, i.e., "0x00" in an entry designated by the hash key H0. At this time, the hash key table 235 may output "0x00" as the address ADD of the first process unit PU1 (=A1A2A3A4). In addition, the hash key generator 233-1 generates a hash key H2 corresponding to subsequent 4-byte data A2A3A4B5 and the first counter 233-2 generates "0x01" as the first count value BCNT indicating the start position of the 4-byte data A2A3A4B5.

The hash key generator 233-1 generates a hash key H4 corresponding to subsequent 4-byte data A3A4B5B6 and the first counter 233-2 generates "0x02" as the first count value BCNT indicating the start position of the 4-byte data A3A4B5B6. The hash key generator 233-1 generates a hash key H6 corresponding to subsequent 4-byte data A4B5B6B7 and the first counter 233-2 generates "0x03" as the first count value BCNT indicating the start position of the 4-byte data A4B5B6B7.

The hash key generator 233-1 generates a hash key H8 corresponding to a second process unit PU2, i.e., 4-byte data B5B6B7B8 and the first counter 233-2 generates "0x04" as the first count value BCNT indicating the start position of the 4-byte data B5B6B7B8. At this time, the hash key table 235 may output "0x04" as the address ADD of the second process unit PU2 (=B5B6B7B8).

The hash key generator 233-1 generates a hash key corresponding to a third process unit PU3, i.e., 4-byte data C1C2A3A4 and the first counter 233-2 generates "0x08" as the first count value BCNT indicating the start position of the 4-byte data C1C2A3A4. At this time, the hash key table 235 may output "0x08" as the address ADD of the third process unit PU3 (=C1C2A3A4).

The hash key generator 233-1 generates a hash key H1 corresponding to a fourth process unit PU4, i.e., 4-byte data B1B2B3B4 and the first counter 233-2 generates "0x0C" as the first count value BCNT indicating the start position of the 4-byte data B1B2B3B4. At this time, the hash key table 235 may output "0x0C" as the address ADD.

The hash key generator 233-1 generates a hash key H7 corresponding to a fifth process unit PU4, i.e., 4-byte data C3C4A3A4 and the first counter 233-2 generates "0x40" as the first count value BCNT indicating the start position of the 4-byte data C3C4A3A4. At this time, the hash key table 235 may output "0x40" as the address ADD.

When a sixth process unit PU6, i.e., B1B2B3B4 which is the same as the fourth process unit PU4 (=B1B2B3B4) is received, the hash key generator 233-1 generates the hash key H1 the same as the hash key H1 for the fourth process unit PU4 and the first counter 233-2 generates "0x44" as the first count value BCNT indicating the start position of the 4-byte data B1B2B3B4 of the sixth process unit PU6. At this time, the hash key table 235 outputs "0x0C" instead of "0x44" as the address of the sixth process unit PU6 (=B1B2B3B4) and the address ADD in the entry corresponding to the hash key H1 is updated from "0x0C" to "0x44".

When a current data block to be processed matches or is the same as a previous data block, the hash key table 235 may output the address ADD corresponding to the hash key Hi generated for each data block to the buffer memory controller 237.

Figure 5:
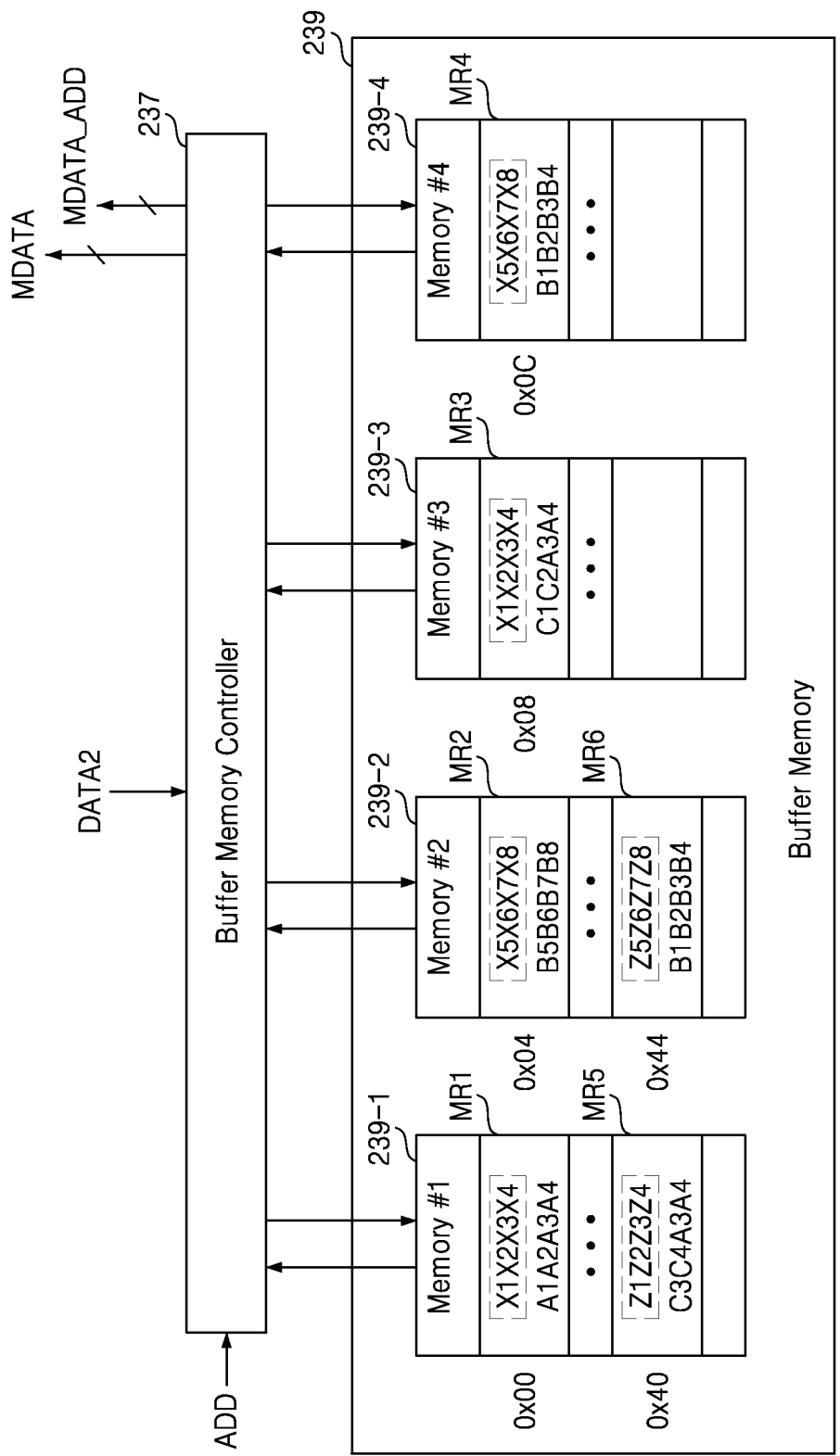
FIG. 5 is a block diagram showing an example of a buffer memory controller and a buffer memory illustrated in FIG. 2.

FIG. 5 is a block diagram showing an example of the buffer memory controller 237 and the buffer memory 239 illustrated in FIG. 2. Referring to FIGS. 2 and 5, the buffer memory controller 237 transmits an extended reference data block MDATA and an extended reference data block start address MDATA_ADD indicating the start position of the extended reference data block MDATA to the comparison circuit 241 based on the address ADD output from the hash key generation circuit 233.

The extended reference data block MDATA includes part of a previous reference data block stored in one of different memories 239-1 through 239-4 and a current reference data block stored in another one of the memories 239-1 through 239-4.

Also, the buffer memory controller 237 writes the first delayed data block DATA2 to one of the memories 239-1 through 239-4 having an interleaved structure in response to a write address indicating the start position of the first delayed data block DATA2.

The buffer memory 239 includes the memories 239-1 through 239-4 that are allocated using an interleaving method and are independently accessible. Each of the memories 239-1 through 239-4 may be implemented, for example, by a dual-port static random access memory (SRAM). Unlike a single-port SRAM, a dual-port SRAM is configured to perform a read operation and a write operation at the same time in a single cycle.

Since the buffer memory controller 237 uses the memories 239-1 through 239-4 that respectively have different addresses allocated using the interleaving method, the buffer memory controller 237 can read in parallel (i.e., simultaneously or at the same time) the part of the previous reference data block and the current reference data block.

Figure 6:
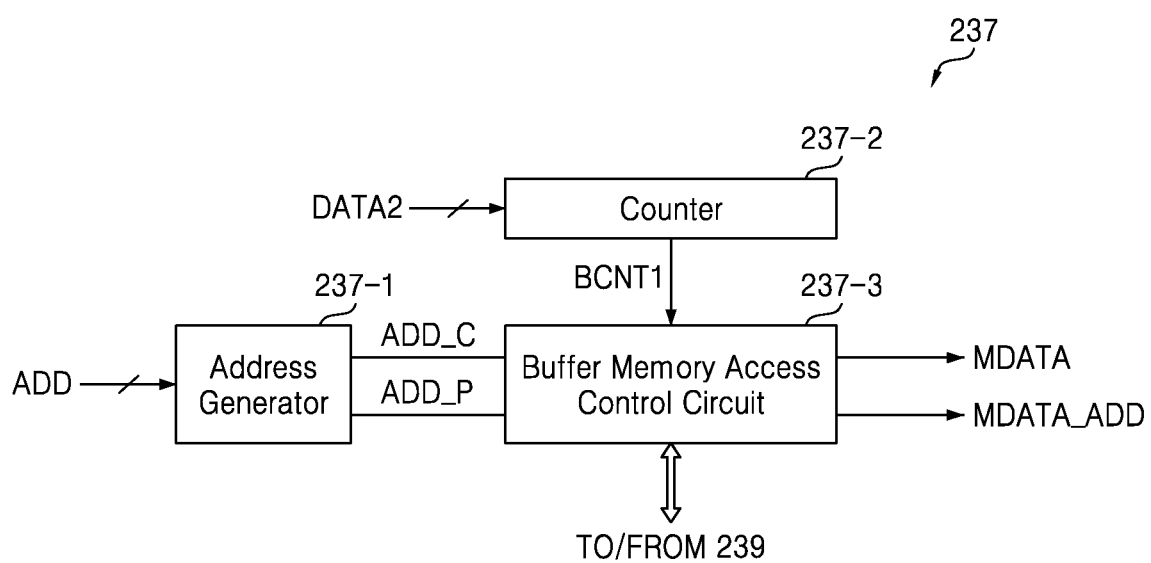
FIG. 6 is a block diagram showing an example of the buffer memory controller illustrated in FIG. 2.

FIG. 6 is a block diagram showing an example of the buffer memory controller 237 illustrated in FIG. 2. As an example, a procedure for processing the first process unit PU1, i.e., the first data block A1A2A3A4 will be described in detail with reference to FIGS. 1A through 8.

When the buffer memory controller 237 receives the address ADD (=0x00) indicating the start position of the data block A1A2A3A4 corresponding to the hash key H0 for the first process unit PU1 from the hash key generation circuit 233 and receives the first delayed data block DATA2 (=A1A2A3A4) through the input data register 231, an address generator 237-1 included in the buffer memory controller 237 generates a current reference address ADD_C and an immediately previous (or a previous) reference address ADD_P.

At this time, the current reference address ADD_C is the same as the address ADD (=0x00) output from the hash key generation circuit 233 and the immediately previous reference address ADD_P is an address of a memory region immediately before a current memory region.

When the data block of the first process unit PU1 is an initial data block, the immediately previous reference address ADD_P may be an address set by default.

A second counter 237-2 illustrated in FIG. 6 counts the start position of the first delayed data block DATA2 (=A1A2A3A4) and generates a second count value BCNT1 (=0x00). At this time, the second count value BCNT1 corresponds to an address of a memory region in which the first delayed data block DATA2 (=A1A2A3A4) will be stored.

In other embodiments, the second counter 237-2 is not provided. In this case, instead of the second count value BCNT1, the first count value BCNT (=0x00) of the first counter 233-2 illustrated in FIG. 3 may be directly input to a buffer memory access control circuit 237-3.

The buffer memory access control circuit 237-3 reads a current reference data block, e.g., 4-byte data X1X2X3X4, stored in a first memory region MR1 corresponding to the current reference address ADD_C (=0x00) and in parallel (at the same time) reads part of an immediately previous reference data block, e.g., 2-byte data, stored in a memory region corresponding to the immediately previous reference address ADD_P set by default. The immediately previous reference data block may be a data block stored in a memory region selected by default.

Thereafter, the buffer memory access control circuit 237-3 writes the first delayed data block DATA2 (=A1A2A3A4) to the first memory region MR1 in the first memory 239-1, which corresponds to the address ADD (=0x00). Accordingly, the current reference data block X1X2X3X4 is updated with the first delayed data block DATA2 (=A1A2A3A4).

The buffer memory access control circuit 237-3 may output the extended reference data block MDATA, e.g., 6-byte data, which includes the part of the immediately previous reference data block and the current reference data block X1X2X3X4 stored in the first memory region MR1, to the comparison circuit 241. In addition, the buffer memory access control circuit 237-3 may also output the extended reference data block start address MDATA_ADD indicating the start position of the extended reference data block MDATA to the comparison circuit 241.

Figure 7:
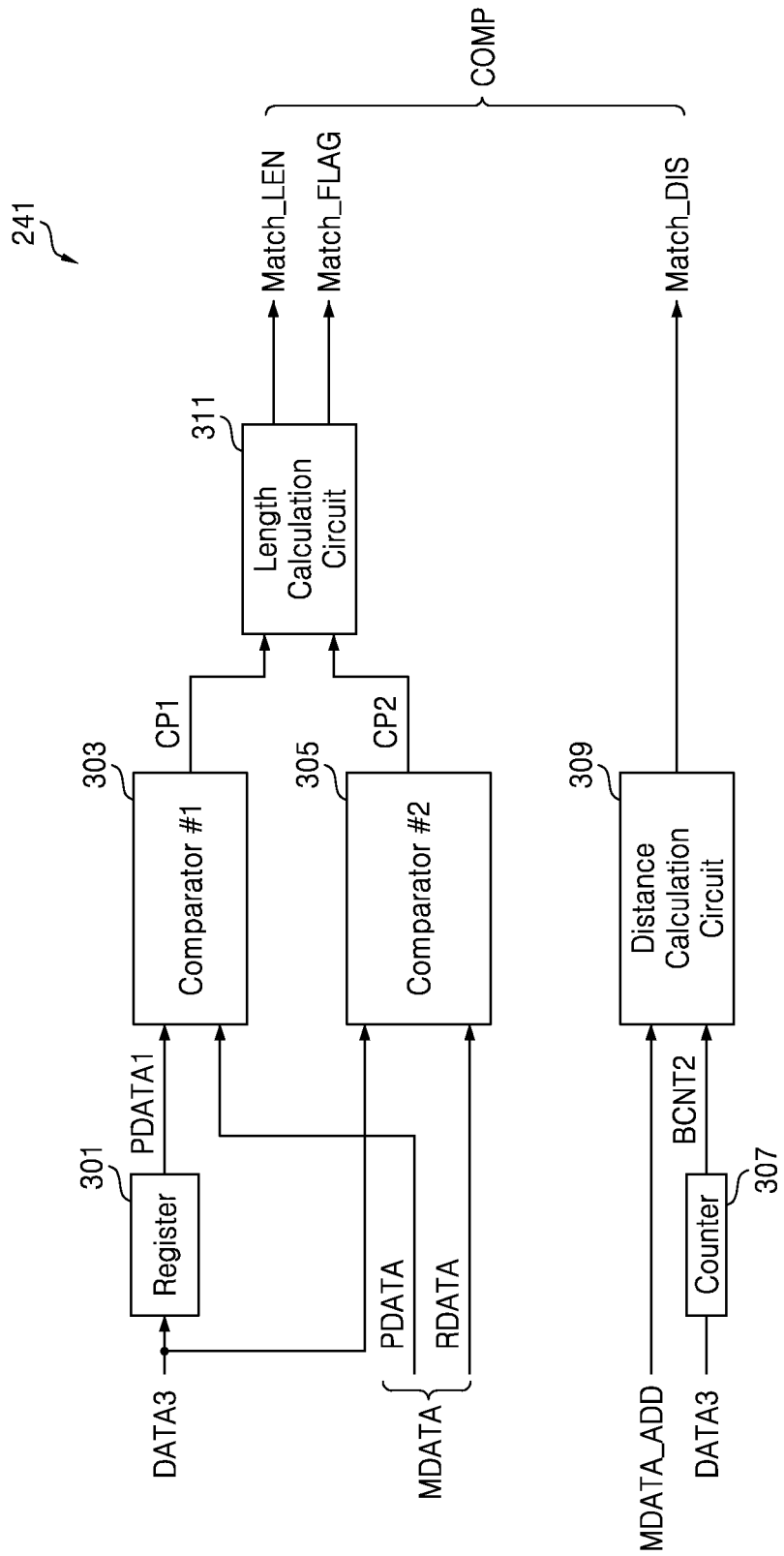
FIG. 7 is a block diagram showing an example of a comparison circuit illustrated in FIG. 2.

FIG. 7 is a block diagram showing an example of the comparison circuit 241 illustrated in FIG. 2. A register 301 stores part PDATA1 of a data block immediately previous to the second delayed data block DATA3 (=A1A2A3A4). When the second delayed data block DATA3 (=A1A2A3A4) is the initial data block, the 2-byte data PDATA1 stored in the register 301 may be set by default.

A first comparator 303 compares the 2-byte data PDATA1 stored in the register 301 with part PDATA of the immediately previous reference data block and generates a first comparison signal CP1 according to a result of the comparison. Simultaneously or in parallel, a second comparator 305 compares a current reference data block RDATA (=X1X2X3X4) with the second delayed data block DATA3 (=A1A2A3A4) and generates a second comparison signal CP2 according to a result of the comparison.

A length calculation circuit 311 generates length information Match_LEN indicating the length of repeated data and match information Match_FLAG indicating matching or mismatching based on the first comparison signal CP1 and the second comparison signal CP2.

When the 2-byte data PDATA1 stored in the register 301 is not the same as the part PDATA of the immediately previous reference data block and the current reference data block RDATA (=X1X2X3X4) is not the same as the second delayed data block DATA3 (=A1A2A3A4), the length calculation circuit 311 may output the match information Match_FLAG having a first level, e.g., a high level. At this time, the length calculation circuit 311 may not generate the length information Match_LEN.

A distance calculation circuit 309 may generate distance information Match_DIS indicating the relative position, distance or offset of an extended data block based on the extended reference data block start address MDATA_ADD and a third count value BCNT2. In other embodiments, the distance calculation circuit 309 may be enabled or disabled based on the match information Match_FLAG.

The third counter 307 may count the start position of the second delayed data block DATA3 (=A1A2A3A4) and generate the third count value BCNT2 according to a result of the counting.

In other embodiments, the third counter 307 is not provided. In this case, instead of the third count value BCNT2, the first count value BCNT of the first counter 233-2 illustrated in FIG. 3 may be directly input to the distance calculation circuit 309. Control information COMP for controlling the operation of the compressed-data generation circuit 243 includes the length information Match_LEN, the match information Match_FLAG, and the distance information Match_DIS.

Figure 8:
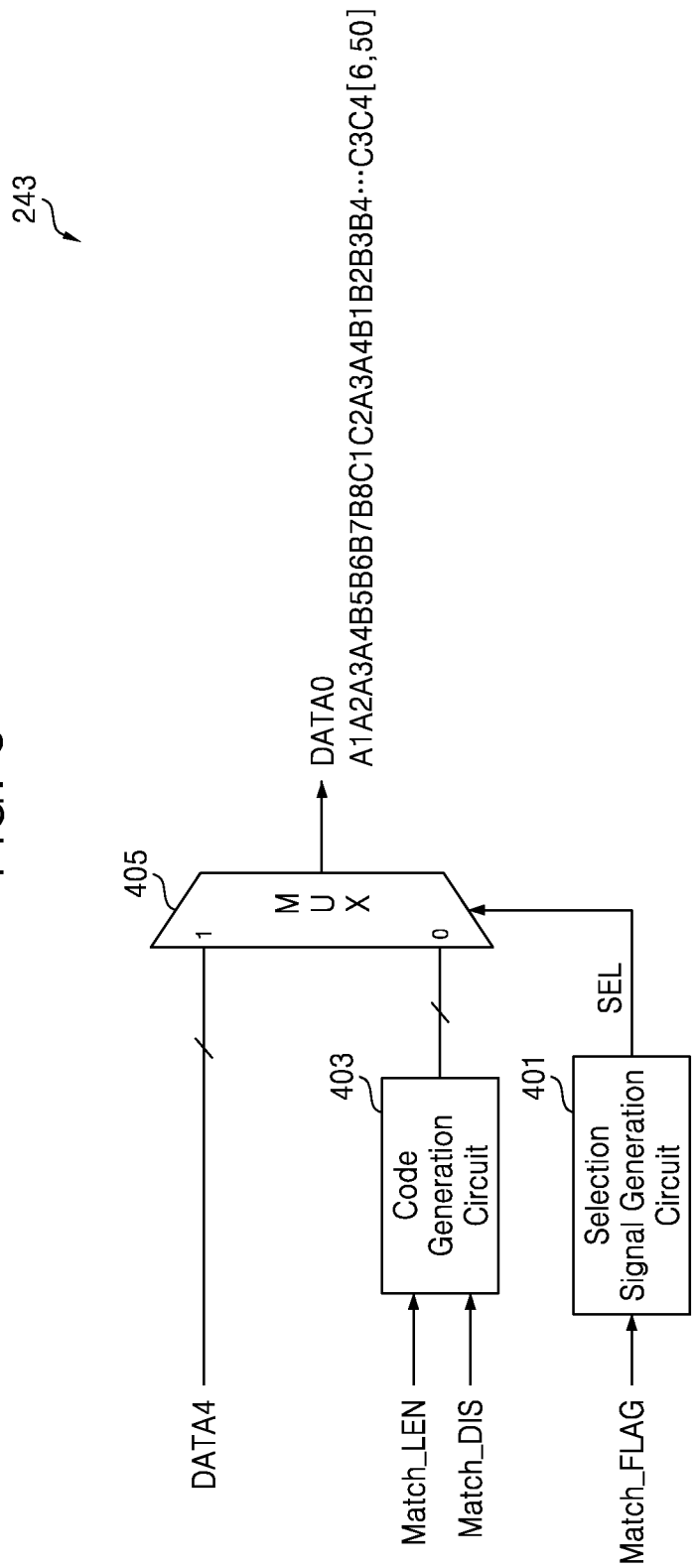
FIG. 8 is a block diagram showing an example of a compressed-data generation circuit illustrated in FIG. 2.

FIG. 8 is a block diagram showing an example of the compressed-data generation circuit 243 illustrated in FIG. 2. The compressed-data generation circuit 243 may generate a literals and length/distance (LLD) data based on the control information COMP and the third delayed data block DATA4.

In detail, the compressed-data generation circuit 243 may determine whether the third delayed data block DATA4 to be processed is a repeated data block or a repeated data pattern based on the control information COMP and output the third delayed data block DATA4 as it is without compressing it or compress an extended data block including the third delayed data block DATA4 according to a result of the determination.

At this time, an uncompressed data block is referred to as "literal data" generated using a first encoding scheme and a compressed data block or a compressed extended data block is referred to as "length/distance data" generated using a second encoding scheme. For example, the compressed-data generation circuit 243 may be implemented by a finite state machine (FSM).

A selection signal generation circuit 401 generates a selection signal SEL in response to the match information Match_FLAG. For instance, when the match information Match_FLAG is a signal at the first level, a selection circuit 405 outputs the third delayed data block DATA4 (=A1A2A3A4) as it is without compressing it in response to the match information Match_FLAG having the first level. Accordingly, the literal data A1A2A3A4 is output as output data DATA0.

A procedure for processing the data block B5B6B7B8 of the second process unit PU2 will be described in detail with reference to FIGS. 1A through 8 below.

When the buffer memory controller 237 receives an address ADD (=0x04) indicating the start position of the data block B5B6B7B8 of the second process unit PU2 from the hash key generation circuit 233 and receives the first delayed data block DATA2 (=B5B6B7B8) through the input data register 231, the address generator 237-1 generates the current reference address ADD_C (=0x04) and the immediately previous reference address ADD_P (=0x00).

According to the embodiments of the address generator 237-1, when "0x02" is output as the immediately previous reference address ADD_P, the buffer memory access control circuit 237-3 may read data stored at the address "0x02" and the address "0x03". In addition, when "0x00" is output as the immediately previous reference address ADD_P, the buffer memory access control circuit 237-3 may also read the data stored at the address "0x02" and the address "0x03".

The second counter 237-2 counts the start position of the first delayed data block DATA2 (=B5B6B7B8) and generates the second count value BCNT1 (=0x04), i.e., a write address according to a result of the counting.

The buffer memory access control circuit 237-3 reads a current reference data block X5X6X7X8 stored in a second memory region MR2 in the second memory 239-2, which corresponds to the current reference address ADD_C (=0x04), and in parallel reads part, e.g., 2-byte data A3A4, of an immediately previous reference data block A1A2A3A4 stored in the first memory region MR1 in the first memory 239-1, which corresponds to the immediately previous reference address ADD_P (=0x00).

Thereafter, the buffer memory access control circuit 237-3 writes the first delayed data block DATA2 (=B5B6B7B8) to the second memory region MR2 in the second memory 239-2 in response to the write address BCNT1 (=0x04) (or BCNT (=0x04) in other embodiments). Accordingly, the current reference data block X5X6X7X8 stored in the second memory region MR2 is updated with the first delayed data block DATA2 (=B5B6B7B8).

The buffer memory access control circuit 237-3 may output the extended reference data block MDATA, e.g., 6-byte data A3A4X5X6X7X8, which includes the part A3A4 of the immediately previous reference data block A1A2A3A4 stored in the first memory region MR1 and the current reference data block X5X6X7X8 stored in the second memory region MR2, to the comparison circuit 241. In addition, the buffer memory access control circuit 237-3 may also output the extended reference data block start address MDATA_ADD (=0x02) indicating the start position of the extended reference data block MDATA to the comparison circuit 241.

The register 301 illustrated in FIG. 7 stores the part A3A4 of the data block A1A2A3A4 immediately previous to the second delayed data block DATA3 (=B5B6B7B8).

The first comparator 303 compares the 2-byte data PDATA1 (=A3A4) stored in the register 301 with the part PDATA (=A3A4) of the immediately previous reference data block and generates the first comparison signal CP1 according to a result of the comparison. Simultaneously or in parallel, the second comparator 305 compares the current reference data block RDATA (=X5X6X7X8) with the second delayed data block DATA3 (=B5B6B7B8) and generates the second comparison signal CP2 according to a result of the comparison.

The length calculation circuit 311 generates the length information Match_LEN and the match information Match_

FLAG based on the first comparison signal CP1 and the second comparison signal CP2.

When the 2-byte data PDATA1 (=A3A4) stored in the register 301 is the same as the part PDATA (=A3A4) of the immediately previous reference data block and the current reference data block RDATA (=X5X6X7X8) is not the same as the second delayed data block DATA3 (=B5B6B7B8), the length calculation circuit 311 may output the match information Match_FLAG having the first level, e.g., the high level.

The distance calculation circuit 309 may generate the distance information Match_DIS based on the extended reference data block start address MDATA_ADD (=0x02) and the third count value BCNT2 (=0x04). As described above, when the distance calculation circuit 309 is enabled or disabled according to the match information Match_FLAG, the distance calculation circuit 309 may be disabled in response to the match information Match_FLAG having the first level.

The selection circuit 405 illustrated in FIG. 8 outputs the third delayed data block DATA4 (=B5B6B7B8) as it is without compressing it in response to the match information Match_FLAG having the first level. In other words, the third delayed data block DATA4 (=B5B6B7B8) is output as the literal data DATA0.

Procedures for respectively processing the data block C1C2A3A4 of the third process unit PU3, the data block B1B2B3B4 of the fourth process unit PU4, and the data block C3C4A3A4 of the fifth process unit PU5 are substantially the same as the procedure for processing the data block B5B6B7B8 of the second process unit PU2.

Accordingly, reference data blocks Y1Y2Y3Y4, Y5Y6Y7Y8, and Z1Z2Z3Z4 respectively stored in memory regions MR3, MR4, and MR5 are respectively updated with the data blocks C1C2A3A4, B1B2B3B4, and C3C4A3A4.

The selection circuit 405 illustrated in FIG. 8 outputs third delayed data blocks DATA4, i.e., C1C2A3A4, B1B2B3B4, and C3C4A3A4 as they are without compressing them in response to the match information Match_FLAG having the first level. In other words, the third delayed data blocks DATA4 (=C1C2A3A4, B1B2B3B4, and C3C4A3A4) are output as literal data DATA0.

A procedure for processing the data block B1B2B3B4 of the sixth process unit PU6 will be described with reference to FIGS. 1A through 8 below.

The hash key generation circuit 233 generates the hash key H1 corresponding to the data block B1B2B3B4 of the sixth process unit PU6 and outputs the first count value BCNT stored at an entry in the hash key table 235, which corresponding to the hash key H1, to the buffer memory controller 237. Here, the first count value BCNT is the address ADD (=0x0C) indicating the start position of the data block B1B2B3B4 of the fourth process unit PU4.

Also, the hash key generation circuit 233 updates the first count value BCNT of 0x0C stored at the entry corresponding to the hash key H1 with the first count value BCNT of 0x44 indicating the start position of the data block B1B2B3B4 of the sixth process unit PU6. Accordingly, when the new data block B1B2B3B4 is received, the hash key generation circuit 233 outputs the updated first count value BCNT of 0x44 as the address ADD.

The address generator 237-1 included in the buffer memory controller 237 generates the current reference address ADD_C (=0x0C) and the immediately previous reference address ADD_P (=0x08) in response to the address ADD (=0x0C). At this time, the second counter 237-2 counts the start position of the first delayed data block DATA2 (=PU6=B1B2B3B4) and generates the second count value BCNT1 (=0x44), i.e., a write address according to a result of the counting.

The buffer memory access control circuit 237-3 illustrated in FIG. 6 reads a current reference data block B1B2B3B4 stored in the fourth memory region MR4 corresponding to the current reference address ADD_C (=0x0C) and in parallel reads part, e.g., 2-byte data A3A4, of an immediately previous reference data block C1C2A3A4 stored in the third memory region MR3 corresponding to the immediately previous reference address ADD_P (=0x08).

Thereafter, the buffer memory access control circuit 237-3 writes the first delayed data block DATA2 (=PU6=B1B2B3B4) to a sixth memory region MR6 in the second memory 239-2 in response to the write address BCNT1 (=0x44). Accordingly, a current reference data block Z5Z6Z7Z8 stored in the sixth memory region MR6 is updated with the first delayed data block DATA2 (=PU6=B1B2B3B4).

The buffer memory access control circuit 237-3 may output the extended reference data block MDATA, e.g., 6-byte data A3A4B1B2B3B4, which includes the part A3A4 of the immediately previous reference data block C1C2A3A4 stored in the third memory region MR3 and the current reference data block B1B2B3B4 stored in the fourth memory region MR4, to the comparison circuit 241. In addition, the buffer memory access control circuit 237-3 may also output the extended reference data block start address MDATA_ADD (=0x0A) indicating the start position of the extended reference data block MDATA to the comparison circuit 241.

The register 301 stores the part A3A4 of the data block C3C4A3A4 (=PU5) immediately previous to the second delayed data block DATA3 (=PU6=B1B2B3B4).

The first comparator 303 compares the 2-byte data PDATA1 (=A3A4) stored in the register 301 with the part PDATA (=A3A4) of the immediately previous reference data block and generates the first comparison signal CP1 according to a result of the comparison. In parallel with the comparison executed by the first comparator 303, the second comparator 305 compares the current reference data block RDATA (=B1B2B3B4) with the second delayed data block DATA3 (=PU6=B1B2B3B4) and generates the second comparison signal CP2 according to a result of the comparison.

The length calculation circuit 311 generates the length information Match_LEN and the match information Match_FLAG based on the first comparison signal CP1 and the second comparison signal CP2.

When the 2-byte data PDATA1 (=A3A4) stored in the register 301 is the same as the part PDATA (=A3A4) of the immediately previous reference data block and the current reference data block RDATA (=B1B2B3B4) is the same as the second delayed data block DATA3 (=PU6=B1B2B3B4), the length calculation circuit 311 outputs the match information Match_FLAG having a second level, e.g., a low level.

The distance calculation circuit 309 may generate the distance information Match_DIS based on the extended reference data block start address MDATA_ADD and the third count value BCNT2.

The selection circuit 405 outputs a code, i.e., length/distance data generated by a code generation circuit 403 as the output data DATA0 in response to the match information Match_FLAG.

The code generation circuit 403 generates the length/distance data, e.g., compressed data, based on the length information Match_LEN and the distance information Match_DIS. Accordingly, the selection circuit 405 outputs the code, e.g., compressed data [6,50] indicating a length and a distance, instead of extended data, which includes 2-byte data A3A4 included in the fifth process unit PU5 and 4-byte data B1B2B3B4 included in the sixth process unit PU6.

The data compression circuit 230 makes a decision on whether to compress with respect to each data block, thereby increasing a data compression speed. In addition, the data compression circuit 230 may compress extended data, thereby increasing a compression ratio.

The first memory controller 250 may generate a flag indicating whether the data DATA0 output from the data compression circuit 230 has been compressed and may store the flag and the literal or length/distance data in the first data storage device 130. At this time, the literal data or the length/distance data may be stored in the first data storage device 130 through the second data storage device 150

Figure 9:
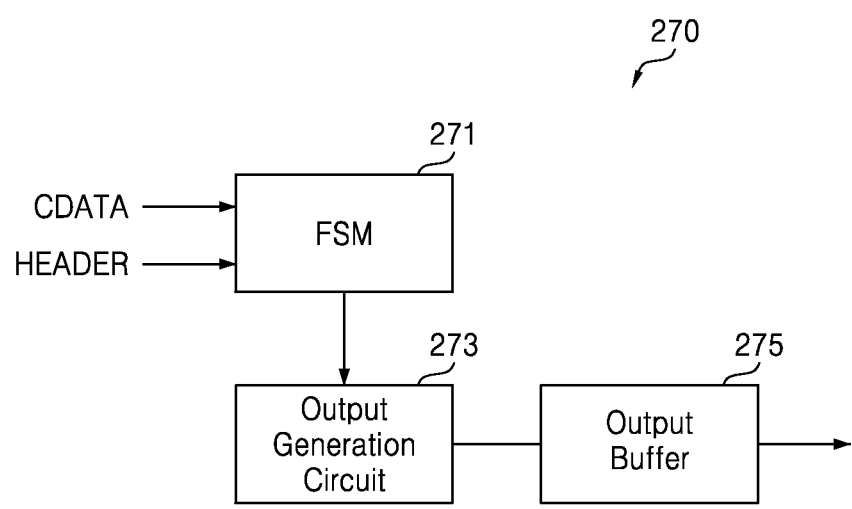
FIG. 9 is a block diagram showing an example of a data decompression circuit illustrated in FIG. 2.

FIG. 9 is a block diagram showing an example of the data decompression circuit 270 illustrated in FIG. 2. Referring to FIG. 9, the data decompression circuit 270 includes a finite state machine (FSM) 271, an output data generation circuit 273, and an output data buffer 275.

The FSM 271 receives compressed data CDATA including the literal data and the length/distance data and a header including the flag indicating a compressed or uncompressed status of the data and outputs a control signal instructing decompression of the compressed data CDATA based on the header.

The output data generation circuit 273 decompresses the compressed data CDATA based on the compressed data CDATA and the control signal that are output from the FSM 271, and outputs a decompressed data stream DDS to the output data buffer 275. The output data buffer 275 transmits the decompressed data stream DDS to the host interface 210 (FIG. 1A).

Figure 10:
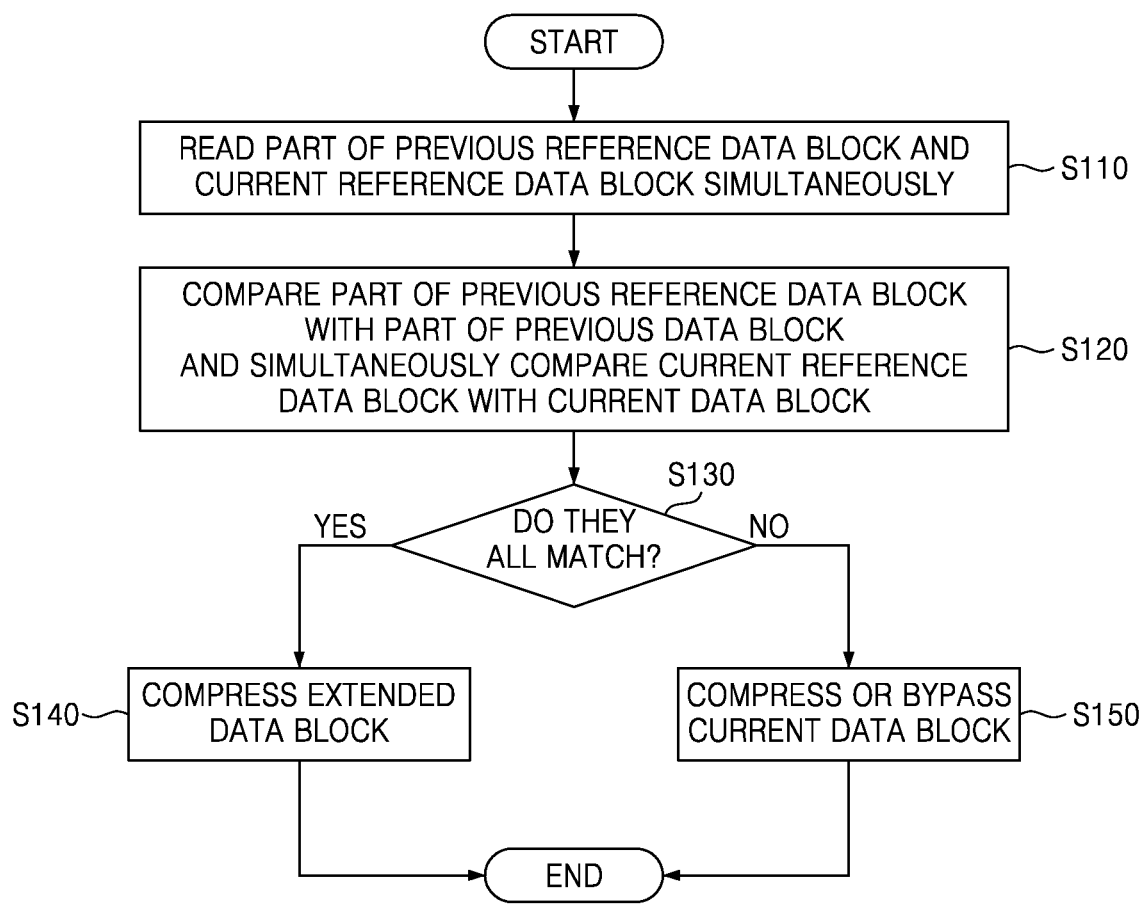
FIG. 10 is a flowchart for reference in describing a data compression method according to some embodiments of the inventive concept.

FIG. 10 is a flowchart for reference in describing a data compression method according to some embodiments of the inventive concept. Referring to FIGS. 1A through 8 and FIG. 10, the buffer memory controller 237 of the data compression circuit 230 reads in parallel part of a previous reference data block and a current reference data block, which are respectively stored in two of the memories 239-1 through 239-4, based on the address ADD output from the hash key generation circuit 233, and transmits the read data to the comparison circuit 241 in operation S110.

The comparison circuit 241 compares the part of the previous reference data block with part of a previous data block and compares the current reference data block with a current data block in operation S120. The comparisons are executed in parallel, i.e., simultaneously.

When the part of the previous data block matches the part of the previous reference data block and the current data block matches the current reference data block, the compressed-data generation circuit 243 compresses an extended data block, which includes the part of the previous data block and the current data block, and outputs the compressed data, i.e., length/distance data in operation S140.

However, when the current data block does not match the current reference data block while the part of the previous data block matches the part of the previous reference data block, the compressed-data generation circuit 243 compresses or bypasses the current data block in operation S150.

When the current data block matches the current reference data block while the previous data block does not match the previous reference data block, the data compression circuit 230 reads an extended reference data block from the buffer memory 239, compares the extended reference data block with the extended data block, and compresses the extended data block based on a result of the comparison.

Here, the extended reference data block includes the part of the previous reference data block and the current reference data block. As mentioned previously, the ratio of the size of the extended reference data block to the size of the current reference data block is not an integer but a mixed decimal.

As described above, the data compression circuit 230 may output a current data block as literal data, output length/distance data generated by compressing a previous data block and the current data block, or output length/distance data generated by compressing an extended block including part of the previous data block and the current data block according to the repetitiveness of the previous data block and the repetitiveness of the current data block.

Figure 11:
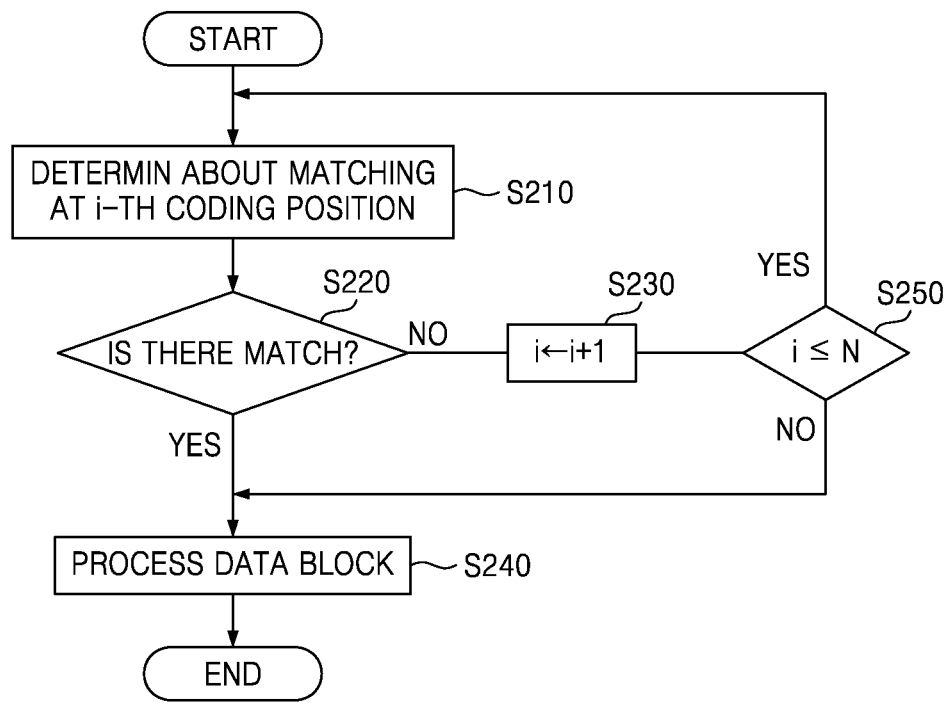
FIG. 11 is a flowchart for reference in describing a data compression method according to other embodiments of the inventive concept.
Figure 12:
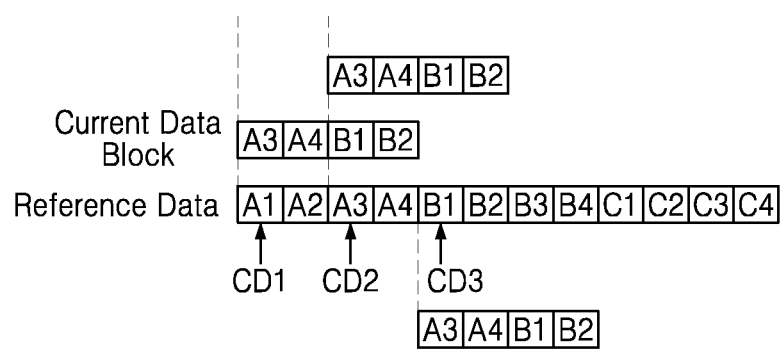
FIG. 12 is a conceptual diagram for explaining an example of the data compression method illustrated in FIG. 11.

FIG. 11 is a flowchart of a data compression method according to other embodiments of the inventive concept. FIG. 12 is a conceptual diagram for explaining the data compression method illustrated in FIG. 11. A method of compressing a data block when a coding position is changed will be described in detail with reference to FIGS. 1A, 11, and 12.

As shown in FIG. 12, coding positions CD1, CD2, and CD3 indicate a start position of a data block to be compressed.

In order to determine about the matching or repetition between a current data block CDB (=A3A4B1B2) to be processed and a reference data block RDB, the data compression circuit 230 determines whether the current data block CDB (=A3A4B1B2) matches a first reference data block RDB (=A1A2A3A4) at an i-th coding position CD1 in operation S210. Here, "i" is a natural number starting from 1, and it is assumed that N is a natural number of 3.

When there is no match at the i-th coding position CD1 in operation S220, that is, when the current data block CDB (=A3A4B1B2) does not match the first reference data block RDB (=A1A2A3A4), the data compression circuit 230 changes a coding position from the i-th coding position CD1 to an (i+1)-th coding position CD2 in operation S230. When (i+1) is less than or equal to N in operation S250, the data compression circuit 230 determines whether the current data block CDB (=A3A4B1B2) matches a second reference data block RDB (=B1B2B3B4) at the (i+1)-th coding position CD2 in operation S210.

Where there is no match at the (i+1)-th coding position CD2 in operation S220, the data compression circuit 230 changes the coding position from the (i+1)-th coding position CD2 to an (i+2)-th coding position CD3 in operation S230. When (i+1) is less than or equal to N in operation S250, the data compression circuit 230 determines whether the current data block CDB (=A3A4B1B2) matches a third reference data block RDB (=A3A4B1B2) at the (i+2)-th coding position CD3 in operation S210.

When there is a match at the (i+2)-th coding position CD3 in operation S220, the data compression circuit 230 compresses the current data block CDB (=A3A4B1B2) into length/distance data based on the third reference data block RDB (=A3A4B1B2) in operation S240.

However, when there is no match at the (i+2)-th coding position CD3 in operation S220, the data compression circuit 230 changes the coding position from the (i+2)-th coding position CD3 to an (i+3)-th coding position in operation S230. However, since (i+1) is greater than N in operation S250, the current data block CDB (=A3A4B1B2) is output as literal data in operation S240.

As described above, according to some embodiments of the inventive concept, compression is performed on each data block, so that a data compression speed is increased. In addition, since an extended data block is compressed, a decrease in a compression ratio is avoided.

Since an extended reference data block is processed using interleaved memories or independently accessible memories, compression efficiency is enhanced.

Moreover, determination of matching properties between part of a data block that has already been processed and part of previous reference data is made, so that a data compression ratio or efficiency is increased.

While the inventive concept has been particularly shown and described with reference to exemplary embodiments thereof, it will be understood by those of ordinary skill in the art that various changes in forms and details may be made therein without departing from the spirit and scope of the inventive concept as defined by the following claims.

What is claimed is:

1. A data compression method comprising:
   receiving an input data stream including a previous data block and a current data block;
   adjusting each delay of the current data block using a corresponding one of delay circuits and generating a first delayed data block and a second delayed data block;
   executing a first comparison of only a part of the previous data block with only a part of a previous reference data block, and a second comparison of all of the first delayed data block with all of a current reference data block, wherein the first and second comparisons are executed in parallel; and
   selectively, based on results of the first and second comparisons, outputting the second delayed data block or compressing an extended data block, wherein the extended data block includes the part of the previous data block and the second delayed data block,
   wherein a size of the current data block is greater than a size of the part of the previous data block, and
   wherein a size of the current reference data block is greater than a size of the part of the previous reference data block.

2. The data compression method of claim 1, wherein a first memory region, in which the current reference data block is stored, and a second memory region, in which the previous reference data block is stored, are respectively implemented in different memories which are allocated using an interleaving method and are independently accessible.

3. The data compression method of claim 1, wherein a ratio of a size of the extended data block to a size of the current data block is a mixed decimal.

4. The data compression method of claim 1, further comprising reading in parallel the part of the previous reference data block and the current reference data block from a buffer memory.

5. A data compression method comprising:
   receiving an input data stream including a previous data block and a current data block;
   adjusting each delay of the current data block using a corresponding one of delay circuits and generating a first delayed data block and a second delayed data block;
   reading only a part of a previous reference data block from a memory, and in parallel reading a current reference data block from the memory;
   comparing only a part of the previous data block with only the part of the previous reference data block, and in parallel comparing the first delayed data block with the current reference data block;
   compressing an extended data block when the part of the previous data block matches the part of the previous reference data block, and the first delayed data block matches the current reference data block, wherein the extended data block includes the part of the previous data block and the second delayed data block,
   wherein a size of the current data block is greater than a size of the part of the previous data block, and
   wherein a size of the current reference data block is greater than a size of the part of the previous reference data block.

6. The data compression method of claim 5, further comprising selectively compressing or not compressing the current data block when at least one of the part of the previous data block does not match the part of the previous reference data block, and the current data block does not match the current reference data block.

7. The data compression method of claim 5, wherein the memory is a buffer memory including a first memory region in which the current reference data block is stored, and a second memory region in which the previous reference data block is stored, and the first and second regions are respectively implemented in different memories which are allocated using an interleaving method and are independently accessible.

8. The data compression method of claim 5, wherein a ratio of a size of the extended data block to a size of the current data block is a mixed decimal.

9. A data compression circuit comprising:
   a buffer memory including a first memory region, a second memory region, and a third memory region;
   a buffer memory controller configured to output only a part of a previous reference data block stored in the first memory region and a current reference data block stored in the second memory region in response to an address output from a hash key generation circuit;
   an input data register configured to receive an input data stream, adjust each delay of a current data block included in the input data stream using a corresponding one of delay circuits and generate a first delayed data block and a second delayed data block;
   a comparison circuit configured to determine whether only a part of a previous data block matches only the part of the previous reference data block and whether the first delayed data block matches the current reference data block, and to generate control information according to a determination result; and
   a compressed-data generation circuit configured to selectively output, based on the control information, the second delayed data block or compressed data, wherein the compressed data is generated by compressing an extended data block which includes only the part of the previous data block and the second delayed data block,
   wherein a size of the current data block is greater than a size of the part of the previous data block, and
   wherein a size of the current reference data block is greater than a size of the part of the previous reference data block.

10. The data compression circuit of claim 9, wherein the first memory region, the second memory region, and the third memory region are respectively implemented in different memories, which are allocated using an interleaving method and are independently accessible.

11. The data compression circuit of claim 9, wherein the buffer memory controller reads in parallel the part of the previous reference data block from the first memory region and the current reference data block from the second memory region, and then writes the current data block to the third memory region.

12. The data compression circuit of claim 9, wherein the buffer memory controller comprises:

an address generator configured to generate a first address of the first memory region and a second address of the second memory region using the address; and a buffer memory access control circuit configured to read in parallel the part of the previous reference data block from the first memory region using the first address and the current reference data block from the second memory region using the second address, and to write the current data block to the third memory region based on a third address of the current data block.

13. The data compression circuit of claim 9, wherein the comparison circuit determines in parallel whether the part of the previous data block matches the part of the previous reference data block and whether the current data block matches the current reference data block.

14. The data compression circuit of claim 9, wherein the comparison circuit comprises:

a register configured to store the part of the previous data block;

a first comparator configured to determine whether the part of the previous data block, which is output from the register, matches the part of the previous reference data block, which is output from the buffer memory controller;

a second comparator configured to determine whether the current data block matches the current reference data block;

a length calculation circuit configured to output match information indicating matching or mismatching and length information indicating a length of matching data based on an output signal of the first comparator and an output signal of the second comparator; and a distance calculation circuit configured to output distance information based on an address of the part of the previous data block and an address of the current data block, wherein the control information includes the match information, the length information, and the distance information.

15. The data compression circuit of claim 14, wherein the compressed-data generation circuit comprises:

a selection signal generation circuit configured to generate a selection signal based on the match information;

a code generation circuit configured to generate the compressed data based on the length information and the distance information; and a selection circuit configured to output the current data block or the compressed data in response to the selection signal.

16. A data processing system comprising:

a data storage device;

a host configured to output a data stream including a previous data block and a current data block; and a memory controller comprising an input data register configured to receive the current data block, adjust each delay of the current data block using a corresponding one of delay circuits and generate a first delayed data block and a second delayed data block, wherein the memory controller is configured to determine a matching property of each data block or each extended data block in the data stream from the host, to compress the second delayed data block or the extended data block in the data stream according to a determination result, and to output compressed data to the data storage device, and wherein the memory controller determines the matching property of the previous data block, and then determines a matching property of the extended data block which includes a part of the previous data block and the second delayed data block, the memory controller further comprising a comparison circuit configured to determine in parallel whether the part of the previous data block matches a part of a previous reference data block and whether the first delayed data block matches a current reference data block, wherein a size of the current data block is greater than a size of the part of the previous data block, and wherein a size of the current reference data block is greater than a size of the part of the previous reference data block.

17. The data processing system of claim 16, wherein the memory controller further comprises:

a buffer memory including a first memory region, a second memory region, and a third memory region;

a buffer memory controller configure to output in parallel the part of the previous reference data block stored in the first memory region and the current reference data block stored in the second memory region in response to an address, wherein the comparison circuit is further configured to generate control information according to a determination result; and a compressed-data generation circuit configured to selectively output, based on the control information, the current data block or the compressed data, wherein the compressed data is generated by compressing the extended data block.

18. The data processing system of claim 17, wherein the first memory region, the second memory region, and the third memory region are respectively implemented in different memories respectively having different addresses allocated using an interleaving method.

19. The data processing system of claim 17, wherein the buffer memory controller comprises:

an address generator configured to generate a first address of the first memory region and a second address of the second memory region using the address; and a buffer memory access control circuit configured to read in parallel the part of the previous reference data block from the first memory region using the first address and the current reference data block from the second memory region using the second address, and to write the current data block to the third memory region based on a third address of the current data block.

20. The data processing system of claim 17, wherein the comparison circuit comprises:

a register configured to store the part of the previous data block;

a first comparator configured to determine whether the part of the previous data block, which is output from the register, matches the part of the previous reference data block, which is output from the buffer memory controller;

a second comparator configured to determine whether the current data block matches the current reference data block;

a length calculation circuit configured to output match information indicating matching or mismatching and length information indicating a length of matching data based on an output signal of the first comparator and an output signal of the second comparator; and a distance calculation circuit configured to output distance information based on an address of the part of the previous data block and an address of the current data block, wherein the control information includes the match information, the length information, and the distance information.

21. The data processing system of claim 20, wherein the compressed-data generation circuit comprises:

a selection signal generation circuit configured to generate a selection signal based on the match information;

a code generation circuit configured to generate the compressed data based on the length information and the distance information; and a selection circuit configured to output the current data block or the compressed data in response to the selection signal.

22. The data processing system of claim 16, wherein a ratio of a size of the extended data block to a size of the current data block is not an integer.

23. The data processing system of claim 16, wherein the data storage device is a flash memory, an embedded multimedia card (eMMC), a universal flash storage (UFS), a universal serial bus (USB) flash drive, or a solid state drive (SSD).

24. The data processing system of claim 16, wherein the data storage device is a hard disk drive.

25. The data processing system of claim 16, wherein the data processing system is a smart phone, a tablet personal computer, mobile internet device, or an e-book.

* * * * *